(12) United States Patent
Jung et al.

(10) Patent No.: US 9,691,462 B2
(45) Date of Patent: Jun. 27, 2017

(54) LATCH OFFSET CANCELATION FOR MAGNETORESISTIVE RANDOM ACCESS MEMORY

(71) Applicant: QUALCOMM Incorporated, San Diego, CA (US)

(72) Inventors: Seong-Ook Jung, Seoul (KR); Taehui Na, Seoul (KR); Byungkyu Song, Seoul (KR); Jung Pill Kim, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 47 days.

(21) Appl. No.: 14/499,153

(22) Filed: Sep. 27, 2014

(65) Prior Publication Data
US 2016/0093350 A1 Mar. 31, 2016

(51) Int. Cl.
*G11C 11/16* (2006.01)
*G11C 7/06* (2006.01)
*G11C 7/08* (2006.01)
*G11C 7/12* (2006.01)

(52) U.S. Cl.
CPC .......... *G11C 11/1673* (2013.01); *G11C 7/062* (2013.01); *G11C 7/065* (2013.01); *G11C 7/08* (2013.01); *G11C 7/12* (2013.01); *G11C 11/1653* (2013.01); *G11C 11/1655* (2013.01); *G11C 11/1675* (2013.01); *G11C 11/165* (2013.01)

(58) Field of Classification Search
CPC .................................. G11C 11/1673
USPC ........................................ 365/158
See application file for complete search history.

(56) References Cited

U.S. PATENT DOCUMENTS

| 6,590,805 | B2 | 7/2003 | Lu et al. | |
|---|---|---|---|---|
| 7,130,235 | B2 | 10/2006 | Perner | |
| 7,986,570 | B2 | 7/2011 | Slamowitz et al. | |
| 2003/0067801 | A1* | 4/2003 | Lu et al. | 365/158 |
| 2007/0024325 | A1 | 2/2007 | Chen | |

(Continued)

FOREIGN PATENT DOCUMENTS

| NO | 2014018063 A1 | 1/2014 |
|---|---|---|
| NO | 2015030937 A1 | 3/2015 |
| WO | 2015123069 A1 | 8/2015 |

OTHER PUBLICATIONS

International Search Report and Written Opinion—PCT/US2015/050361—ISA/EPO—Dec. 8, 2015.

*Primary Examiner* — Alexander Sofocleous
*Assistant Examiner* — Mushfique Siddique
(74) *Attorney, Agent, or Firm* — MG-IP Law, P.C.

(57) ABSTRACT

Systems and methods relate to operations on a magnetoresistive random access memory (MRAM) bit cell using a circuit configured in multiple phases. In a sensing circuit phase, the circuit configured to determine a first differential voltage between a data voltage across the bit cell and a reference voltage. In a pre-amplifying phase, the circuit is configured to pre-amplify the first differential voltage to generate a pre-amplified differential voltage, which does not have offset voltages that may arise due to process variations. In a sense amplifier phase, the circuit is configured to amplify the pre-amplified differential voltage in a latch. Generation of the pre-amplified differential voltage cancels offset voltages which may arise in the latch. In a write phase, the circuit is further configured to write a write data value to the MRAM bit cell.

17 Claims, 12 Drawing Sheets

(56) References Cited

U.S. PATENT DOCUMENTS

| | | | |
|---|---|---|---|
| 2007/0205807 A1 | 9/2007 | Tsuchi et al. | |
| 2010/0039851 A1 | 2/2010 | Morita et al. | |
| 2011/0255359 A1 | 10/2011 | Sachdev et al. | |
| 2012/0188817 A1* | 7/2012 | Kim et al. | 365/171 |
| 2013/0286721 A1* | 10/2013 | Jung | G11C 11/1673 365/158 |
| 2013/0293286 A1 | 11/2013 | Li et al. | |
| 2014/0003124 A1* | 1/2014 | Youn et al. | 365/148 |
| 2014/0112053 A1* | 4/2014 | Youn et al. | 365/148 |
| 2014/0153313 A1* | 6/2014 | Boujamaa | G11C 7/14 365/148 |
| 2015/0063012 A1* | 3/2015 | Jung | G11C 7/06 365/158 |
| 2016/0093353 A1* | 3/2016 | Jung | G11C 11/1673 365/158 |

\* cited by examiner (READ)

(WRITE)

700

| | SWITCHES | | | | | |
|---|---|---|---|---|---|---|
| | S1 | S2 | S3 | S4 | S5 | S6 |
| Phase 1 (Equalize) | ON | ON | ON | off | off | off |
| Phase 2 (Develop) | off | ON | ON | off | off | off |
| Phase 3 (Pre-amplify) | ON | off | ON | off | off | off |
| Phase 4 (Latch) | ON | off | ON | ON | off | off |
| Phase W (Write) | off | off | off | ON | ON | ON |

*FIG. 7*

LATCH OFFSET CANCELATION FOR MAGNETORESISTIVE RANDOM ACCESS MEMORY

FIELD OF DISCLOSURE

Disclosed aspects pertain to read/write circuits for resistive memory. More particularly, exemplary aspects are directed to a circuit configured for reading a resistive memory bit cell, which overcomes non-idealities of process variations.

BACKGROUND

Memory devices conventionally include arrays of bit cells that each store a bit of data. Each data bit can represent a logical zero ("0") or a logical one ("1"), which may correspond to a state of the bit cell. During a read operation of a selected bit cell, a voltage level close to ground may be representative of "0" and a relatively higher voltage level may be representative of "1". Bit lines are coupled to various bit cells in the memory array and the bit lines couple the bit cells to other components used in read/write operations.

Magnetoresistive random access memory (MRAM) is a non-volatile memory technology where data is stored based on magnetization polarities of bit cells. In contrast to conventional RAM technologies which store data as electric charges or current flows, MRAM uses magnetic elements. A magnetic tunnel junction (MTJ) which is conventionally used as a storage element or bit cell for MRAM technology, can be formed from two magnetic layers, each of which can hold a magnetic moment, separated by an insulating (tunnel barrier) layer. Conventionally, the fixed layer is set to a particular polarity. The free layer's polarity is free to change to match that of an external magnetic field that can be applied. A change in the polarity of the free layer will change the resistance of the MTJ bit cell. For example, when the magnetization polarities are aligned or "parallel," a low resistance state exists, which corresponds to a logical "0". When the magnetization polarities are not aligned or are "anti-parallel," a high resistance state exists, which corresponds to a logical "1".

Thus, an MRAM or MTJ bit cell has a resistance value based on whether the bit cell represents a logical zero ("0") or a logical one ("1"). Specifically, the resistance of the bit cell ($R_{DATA}$) relates to the data stored in the bit cell. For the same or constant current flowing through the bit cell, if the value of $R_{DATA}$ is high relative to a reference resistance ($R_{REF}$), then a relatively high voltage will appear across the bit cell, representing a logical "1". If the value of $R_{DATA}$ is low relative to $R_{REF}$, then a relatively low voltage will appear across the bit cell, representing a logical "0". The difference between the voltage across $R_{DATA}$ ($V_{DATA}$) and the voltage across $R_{REF}$ ($V_{REF}$) therefore indicates the logic state of the bit cell ($\Delta V_1 = V_{DATA} - V_{REF}$).

Thus, in order to write a logical "0" or a logical "1," corresponding write currents are passed through the MTJ bit cell to effect a corresponding alignment of the free layer and the fixed layer, or in other words to program the MTJ bit cell to the corresponding resistance state.

For reading the bit cell, a sensing circuit is conventionally used to determine the differential voltage $\Delta V_1$ and a sense amplifier is used to amplify the differential voltage $\Delta V_1$ to an amplified voltage $\Delta V_2$. The sense amplifier's output is used to determine or read the logical state of the bit cell. As shown in FIG. 1, read circuit 100 includes a sense amplifier 110 comprising a pair of cross-coupled inverters formed by two p-channel metal oxide semiconductor (PMOS) transistors M1 and M2 and two n-channel metal oxide semiconductor (NMOS) transistors M3 and M4. This cross-coupled inverter pair resembles a latch used to store a digital value, and as such, is referred to as a latch circuit or a latch. Due to process variations, the latch in the sense amplifier 110 may develop an offset voltage known as a "latch offset voltage" or simply, an "offset voltage" of the sense amplifier, which will be explained below.

As shown in FIG. 1, PMOS transistor M1 and NMOS transistor M3 are coupled in series between a supply voltage (via a PMOS transistor) and ground (via a NMOS transistor, or footer transistor $T_F$). Between transistors M1 and M3 is Node A. Transistors M2 and M4 are likewise coupled in series between a supply voltage (via the PMOS transistor) and ground (via the NMOS transistor. Between transistors M2 and M4 is Node B.

Nodes A and B are connected to the sensing circuit 120, which will now be explained. The sensing circuit includes a load transistor T7 coupled to a degeneration transistor T9 and a clamping transistor T3 coupled to Node A and to a first multiplexer transistor T5 which is connected to the bit cell (represented by variable resistor $R_{DATA}$). The sensing circuit 120 also includes another load transistor T8 connected to degeneration transistor T10 and clamping transistor T4 connected to Node B and to a second multiplexer transistor T6, which is connected to a reference cell (represented by variable resistor $R_{REF}$).

Load transistors T7 and T8 are diode connected. Clamping transistors T3 and T4 are controlled by the voltage $V_{CLAMP}$, which is a clamp voltage used to control the flow of current through the bit cell and the reference cell. Multiplexor transistors T5 and T6 are controlled by $V_{MUX}$, which is a control signal used to select the bit cell (and reference cell) during a read operation, from other bit cells in the memory array that comprises the bit cell. In a first phase, footer transistor $T_F$ is turned 'off' and $V_{MUX}$ and $V_{CLAMP}$ are high, causing the multiplexer transistors and clamping transistors to be turned 'ON'. As a result, current flows from the supply voltage $V_{DD}$ through both $R_{DATA}$ and $R_{REF}$. Accordingly, voltages $V_{DATA}$ and $V_{REF}$ develop at nodes A and B, respectively. The difference between $V_{DATA}$ and $V_{REF}$ represents a differential voltage $\Delta V_1$.

In a second phase, the multiplexer transistors T5 and T6 are shut off and footer transistor $T_F$ is turned on, which brings the sense amplifier into operation. If $R_{DATA}$ has a higher resistance value than $R_{REF}$ (representing a logical "1"), then $V_{DATA}$ will be higher than $V_{REF}$, and $\Delta V_1$ will be positive at the end of the first phase. If $R_{DATA}$ has a lower resistance value than $R_{REF}$ (representing a logical high "0"), then $V_{DATA}$ will be lower than $V_{REF}$, and $\Delta V_1$ will be negative at the end of the first phase.

In a scenario where $\Delta V_1$ is positive, PMOS transistor M2 will pass relatively less current than PMOS transistor M1, and NMOS transistor M4 will pass relatively more current than NMOS transistor M3. As a result, the voltage on Node B ($V_{REF}$ at the beginning of the second phase) will drop toward ground, and the voltage on Node A ($V_{DATA}$ at the beginning of the second phase) will rise toward supply voltage $V_{DD}$. The resulting voltages at Node A and Node B are shown as $V_{OUT-A}$ and $V_{OUT-B}$, respectively, which are outputs of the sense amplifier. The difference between $V_{OUT-A}$ and $V_{OUT-B}$ represents a differential voltage $\Delta V_2$. In a scenario where $\Delta V_1$ is negative, the opposite will happen. In particular, the voltage on Node A will drop toward ground, and the voltage on Node B will rise toward supply voltage $V_{DD}$ In an ideal sense amplifier, if $\Delta V_1$ is positive at the end of the first phase, then $\Delta V_2$ will be relatively more positive at the end of the second phase. Likewise, if $\Delta V_1$ is negative at the end of the first phase, then $\Delta V_2$ will be relatively more negative at the end of the second phase. However, as previously mentioned, a problem can arise due to transistor mismatches resulting from, for example, process variations. Transistor mismatches arise when two transistors have parameters that are intended to be equal, but are in practice unequal. A threshold voltage ($V_{TH}$) of the transistor, for example, is a voltage that, if applied to a gate of the transistor, will cause current to flow between the source and drain. If the threshold voltages of transistors M1 and M3 do not match the corresponding threshold voltages of M2 and M4 of the sense amplifier 110, then an offset voltage occurs, where the offset voltage $V_{OS}$ of the sense amplifier 110 may be created between Node A and Node B. If the offset voltage $V_{OS}$ diminishes the voltage difference $\Delta V_1$, then $\Delta V_1$ will not properly act upon on the respective gates of transistors M1, M2, M3, and M4. In such a scenario, the sense amplifier 110 of circuit 100 will fail to correctly generate an amplified voltage difference $\Delta V_2$ as expected, and the bit cell will not be read correctly.

SUMMARY

An exemplary aspect relates to a method of operating a magnetoresistive random access memory (MRAM) bit cell. The method comprises: in a sensing circuit phase, determining a first differential voltage between a data voltage across the MRAM bit cell and a reference voltage, using a sensing circuit. Further, in a pre-amplifying phase, the first differential voltage is pre-amplified to generate a pre-amplified differential voltage without offset voltage, and in a sense amplifier phase, the pre-amplified differential voltage is amplified in a sense amplifier, wherein the pre-amplified differential voltage cancels an offset voltage of the sense amplifier.

Another exemplary aspect is directed to an apparatus comprising: a magnetoresistive random access memory (MRAM) bit cell and a circuit. In different phases of operation, the circuit is configured as a sensing circuit to determine a first differential voltage between a data voltage across the MRAM bit cell and a reference voltage, a pre-amplifying circuit to pre-amplify the first differential voltage in order to generate a pre-amplified differential voltage without offset voltage, and a sense amplifier to amplify the pre-amplified differential voltage, wherein the pre-amplified differential voltage cancels an offset voltage of the sense amplifier.

Yet another exemplary aspect is directed to a system comprising: means for determining a first differential voltage between a data voltage across a magnetoresistive random access memory (MRAM) bit cell and a reference voltage, means for pre-amplifying the first differential voltage to generate a pre-amplified differential voltage without offset voltage, and means for amplifying the pre-amplified differential voltage, wherein the pre-amplified differential voltage cancels offset voltages due to process variations in the means for amplifying.

BRIEF DESCRIPTION OF THE DRAWINGS

The accompanying drawings are presented to aid in the description of exemplary aspects are provided solely for illustration of the embodiments and not limitation.

FIG. 7 illustrates a control table for operating the switches in the sense amplifier of FIG. 6.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The words "exemplary" and/or "example" are used herein to mean "serving as an example, instance, or illustration." Any embodiment described herein as "exemplary" and/or "example" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
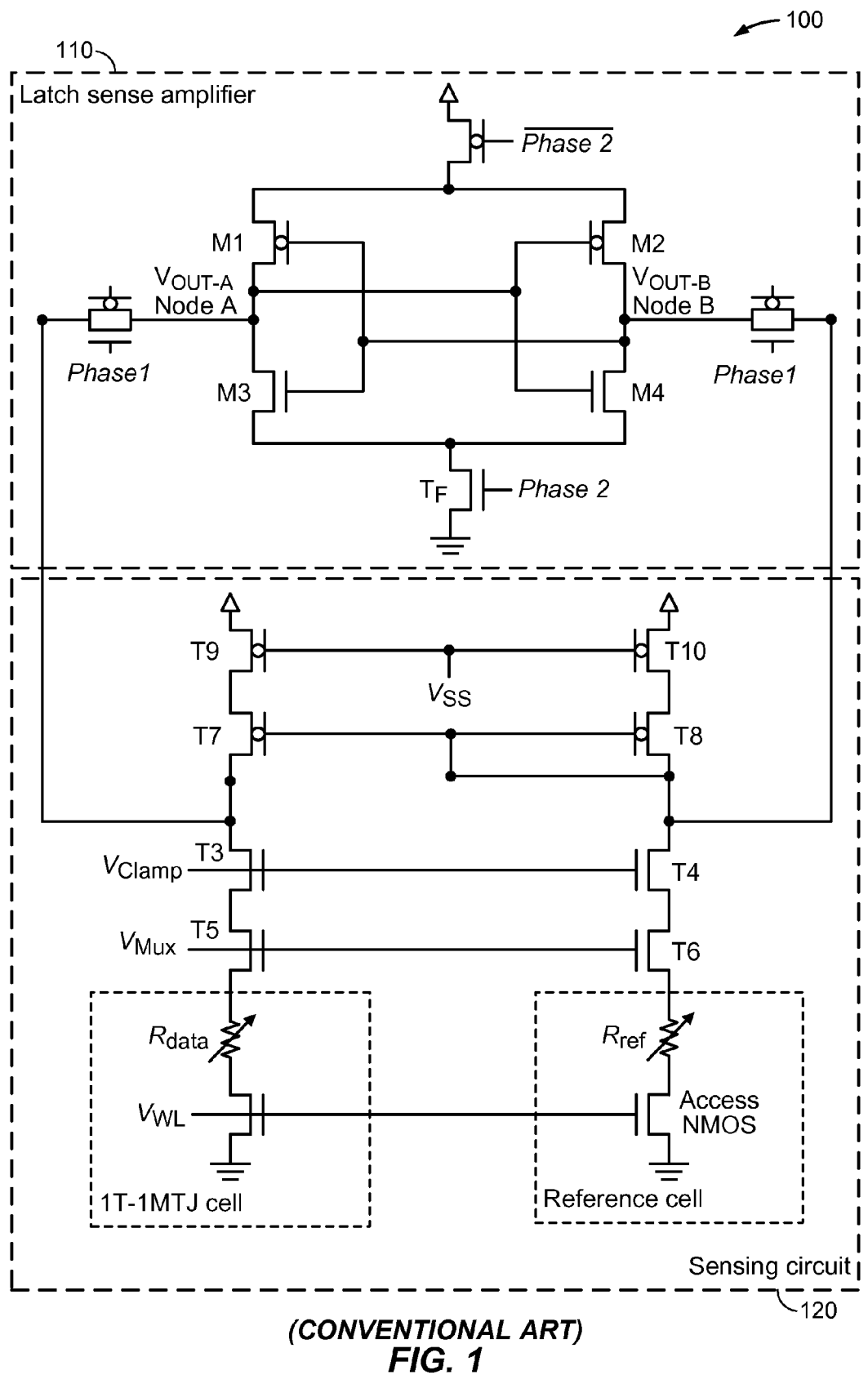
FIG. 1 illustrates a circuit diagram of a conventional MRAM read circuit.
Figure 2:
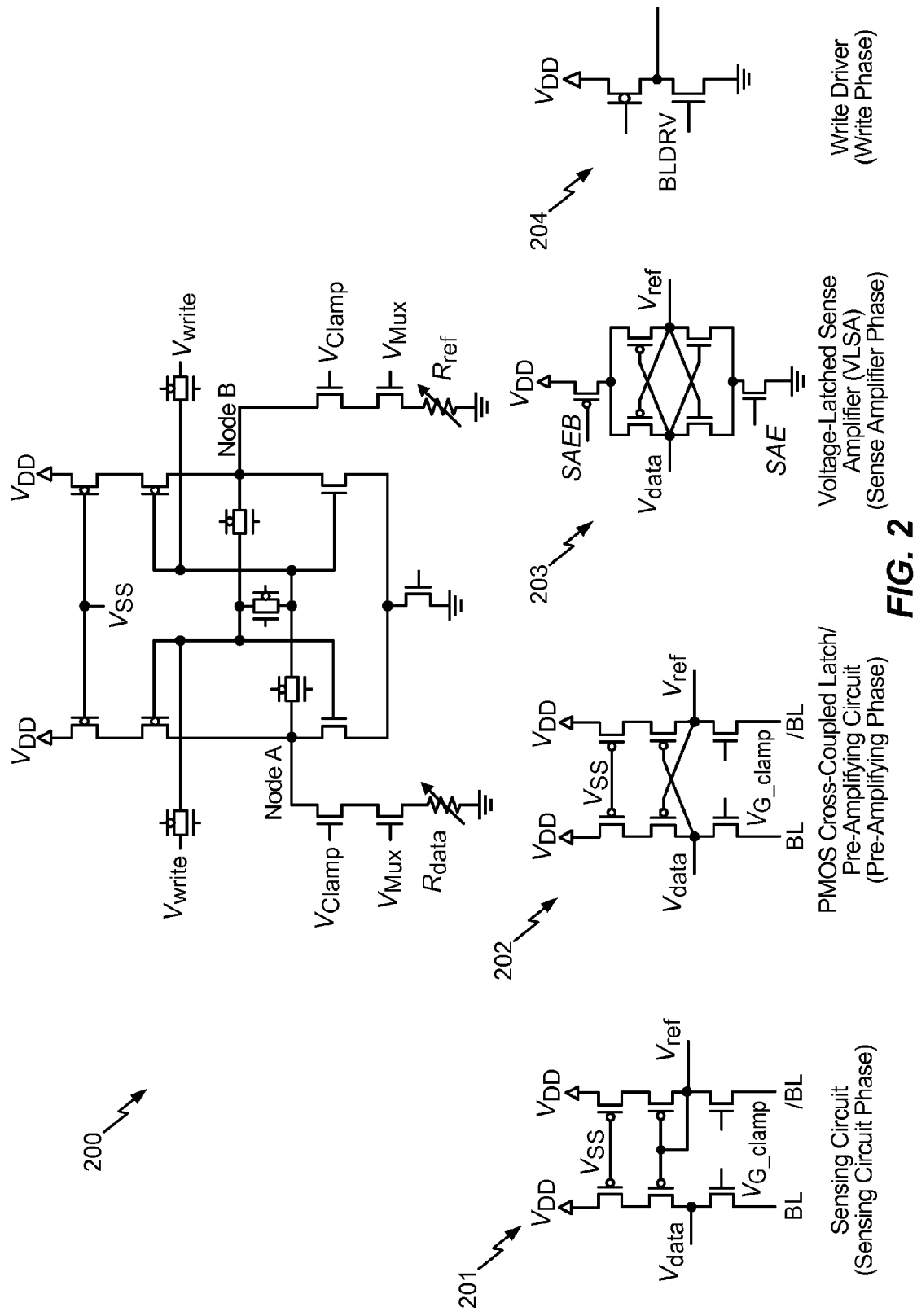
FIG. 2 illustrates a circuit diagram of an MRAM read/write circuit comprising independently reconfigurable switches.

FIG. 2 generally illustrates circuit 200 which operates as a read/write circuit for resistive memory (e.g., MRAM). Circuit 200 can be configured to implement a sensing circuit 201 in a sensing circuit phase, a pre-amplifying circuit 202 in a pre-amplifying phase, and a sense amplifier 203, in a sense amplifier phase, for read operations. Circuit 200 can also be configured to implement a write driver 204, in a write phase, for write operations. The sense amplifier 203 of circuit 200 has transmission gates, which act as switches, disposed between various nodes defined by circuit 200. By independently reconfiguring the transmission gates to either pass current (in an 'ON' configuration) or resist passage of current (in an 'off' configuration), circuit 200 can be controlled to behave differently.

For example, in a sensing circuit phase implemented in sensing circuit 201, the transmission gates of circuit 200 can be controlled such that it operates as a sensing circuit. As can be seen in FIG. 2, circuit 200 develops a differential voltage between the outputs of the sensing circuit, Node A and Node B, representing the difference between $V_{DATA}$ and $V_{REF}$ ($\Delta V_1 = V_{DATA} - V_{REF}$). However, as previously described, an offset voltage $V_{OS}$ can arise due to transistor mismatch, particularly threshold voltage mismatch, of the transistors in the sense amplifier. As previously noted, this offset voltage may be referred to as a latch offset voltage or an offset voltage of the sense amplifier. In order to overcome or cancel this offset voltage, exemplary circuit 200 is configured in a multiple phase operation as follows.

In a pre-amplifying phase implemented in pre-amplifying circuit 202, the transmission gates of circuit 200 can be controlled such that it operates as a pair of cross-coupled inverters resembling a latch circuit. Due to the implementation of the latch using the PMOS transistors shown, the pre-amplifying circuit 202 is also referred to as a PMOS cross-coupled latch (PCL) in this disclosure. The PMOS cross-coupled latch can compare and amplify $\Delta V_1$ without the offset voltage $V_{OS}$ because the same transistors are used in both the developing and pre-amplifying phases. This may also be referred to as a latch offset cancellation (LOC) using the PCL in this description. In a sense amplifier phase implemented in sense amplifier 203, the transmission gates of circuit 200 can be controlled such that it operates as a voltage-latched sense amplifier (VLSA). Moreover, the transmission gates of circuit 200 can be controlled such that it operates as a write driver 204 during a write phase.

Figure 3:
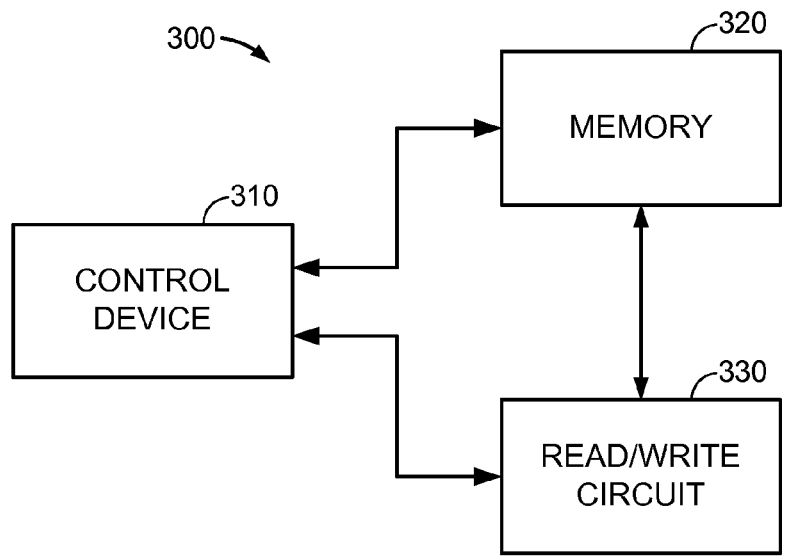
FIG. 3 illustrates a high-level schematic diagram of a system for operating a memory device.

FIG. 3 generally illustrates system 300 for reading and/or writing memory 320 (e.g., MRAM). In system 300, control device 310 sends memory control signals to memory 320 and read/write control signals to circuit 330, which may generally be configured as a read/write circuit for memory 320. The memory control signals may comprise read commands, write commands, data addresses, and/or other signals which cause memory 320 to operate. The sensing signals may comprise phase change signals and/or other signals which cause circuit 330 to operate. In this illustration, a bit cell of memory 320 can be read by a sensing circuit in circuit 300 to generate a differential signal $\Delta V_1$, which is provided to a sense amplifier in circuit 330. The sense amplifier amplifies $\Delta V_1$ in accordance with the control signals received from control device 300 and outputs an amplified differential signal $\Delta V_2$.

Figure 4:
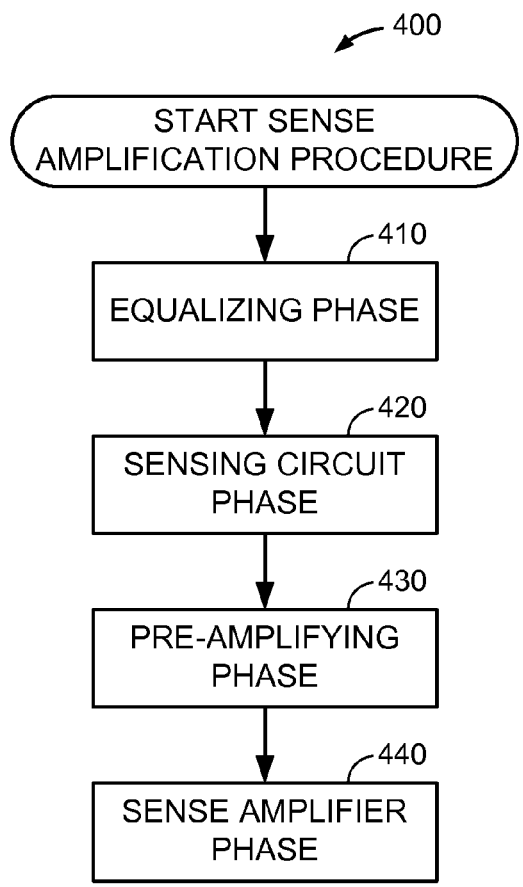
FIG. 4 illustrates a flowchart for operating the MRAM read/write circuit during a read procedure.
Figure 6:
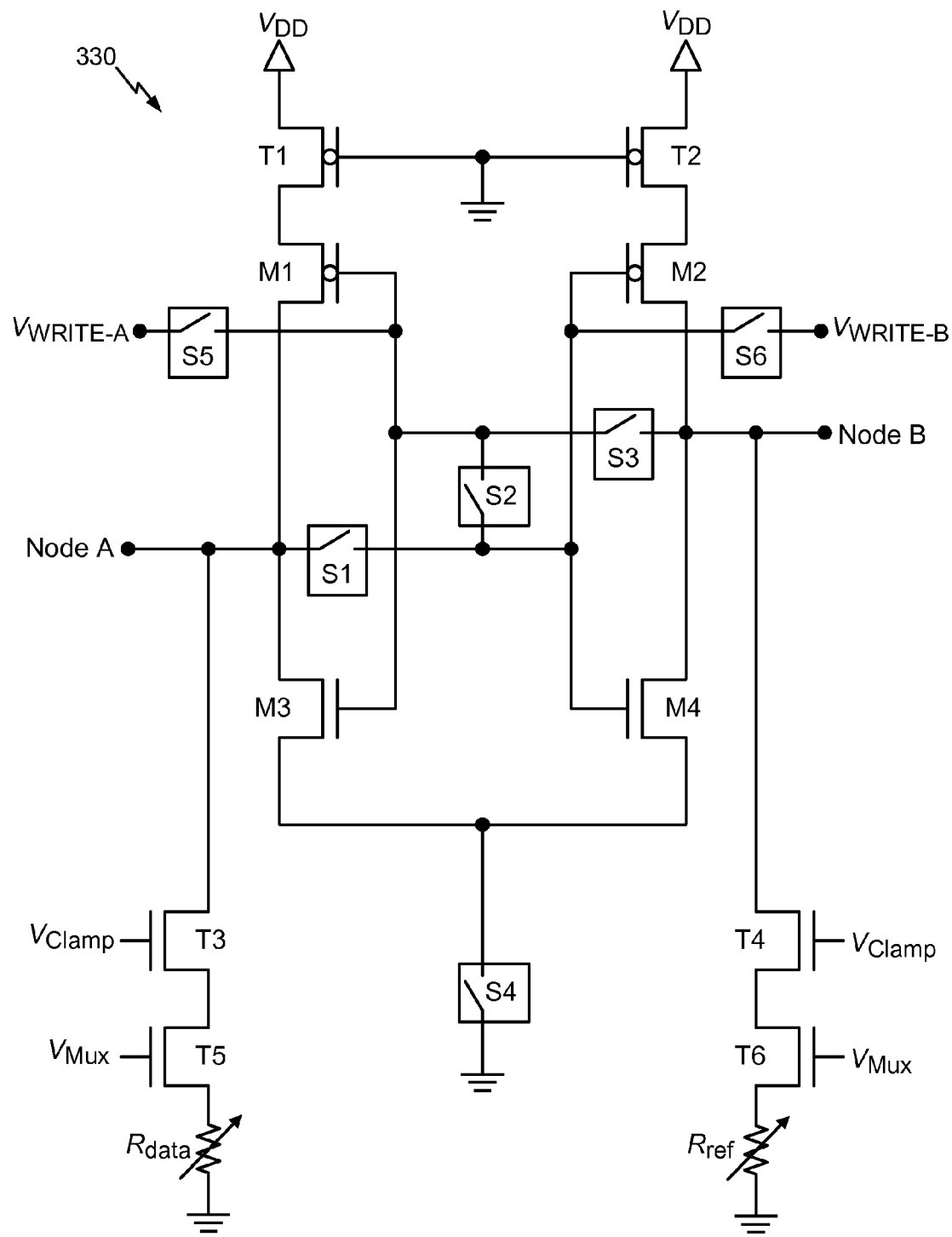
FIG. 6 illustrates a schematic diagram of the MRAM read/write circuit comprising switches.

FIG. 4 generally illustrates a sense amplifier read procedure 400 for operating a sense amplifier such as a sense amplifier in circuit 330, during a read operation. Read procedure 400 may be controlled by a control device such as control device 310. Control device 310 controls read procedure 400 by sending control signals to various switches which are associated with the sense amplifier. Read procedure 400 will be described with combined reference to circuit 330 shown in FIG. 6.

In equalizing phase 410, Node A and Node B, which are both selectively set to a reference voltage but may not be equal, due to mismatch of their load capacitance, are coupled to one another such that the voltages are equalized. Equalizing the first and second nodes is performed prior to determining the first differential voltage in the sensing circuit phase, by selectively coupling the first and second nodes (Node A and Node B) to each other.

In sensing circuit phase 420, a sensing circuit in circuit 330 develops differential voltage signal $\Delta V_E$. Differential voltage signal $\Delta V_1$ reflects the resistance difference between the resistance of a bit cell ($R_{DATA}$) and reference resistance ($R_{REF}$). As a result of the resistance difference, voltage $V_{DATA}$ appears at Node A and voltage $V_{REF}$ appears at Node B. Differential voltage signal $\Delta V_1$ represents the difference between $V_{DATA}$ and $V_{REF}$.

In contrast to conventional implementations, a pre-amplifying phase 430 is introduced in exemplary aspects. In pre-amplifying phase 430, circuit 330 is configured to pre-amplify the differential voltage signal $\Delta V_1$, which overcomes an offset voltage $V_{OS}$ which may be present in the sense amplifier. As previously described, the offset voltage $V_{OS}$ may be caused by, for example, variation in the threshold voltages of the transistors that compose the sense amplifier, and due to the latch circuit structure of transistors in the sense amplifier, the offset voltage may also be referred to as a latch offset voltage of the sense amplifier. A large latch offset voltage $V_{OS}$ can negatively impact the probability that the bit cell will be properly read or in other words, reduce a read access pass yield (RAPY). Thus, in exemplary aspects, by pre-amplifying differential voltage signal $\Delta V_1$ circuit 330 can reduce the impact of latch offset voltage $V_{OS}$ that may be present in the sense amplifier. This is also referred to as latch offset cancellation (LOC). The pre-amplification process drives the larger of $V_{DATA}$ and $V_{REF}$ toward the supply voltage $V_{DD}$ and the smaller of $V_{DATA}$ and $V_{REF}$ toward ground. The pre-amplifying phase 430 therefore generates a pre-amplified differential voltage signal $\Delta V_P$ by amplifying differential voltage signal $\Delta V_1$.

In sense amplifier phase 440, the sense amplifier amplifies the pre-amplified differential voltage signal $\Delta V_P$ using the latch structure, whose offset can be ignored due to large voltage signal $\Delta V_P$, to generate an output differential voltage signal $\Delta V_2$ across Node A and Node B of the sense amplifier of circuit 330. Differential voltage signal $\Delta V_2$ comprises an amplified version of the pre-amplified differential voltage signal $\Delta V_P$ available from the pre-amplifying phase 430.

Figure 5:
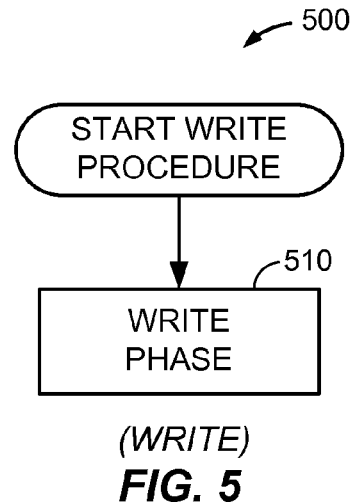
FIG. 5 illustrates a flowchart for operating the MRAM read/write circuit during a write procedure.

FIG. 5 generally illustrates a sense amplifier write procedure 500 for operating circuit 330 in a write operation according to an exemplary aspect. Write procedure 400 may be controlled by control device 310. Control device 310 controls the write procedure 500 by sending control signals to various switches which are associated with circuit 330.

In write phase 510, circuit 330 receives a command to write a specified data to the memory 320. Circuit 330 is configured as a write driver in order to effect the write operation for the specified data to the memory 320.

With reference once again to FIG. 6 a detailed operation of circuit 330 in the various above-described phases, will now be described. Circuit 330 includes a sense amplifier, which comprises a latch formed by a first transistor pair and a second transistor pair. The first transistor pair comprises a PMOS transistor M1 and an NMOS transistor M3 connected in series. The latch has a first node, Node A, appears between PMOS transistor M1 and NMOS transistor M3. Likewise, the second transistor pair comprises a PMOS transistor M2 and an NMOS transistor M4 connected in series. A second node, Node B, appears between PMOS transistor M1 and NMOS transistor M3. Additionally, circuit 330 includes a first switch S1, second switch S2, third switch S3, fourth switch S4, fifth switch S5, and sixth switch S6. These switches are either 'ON', in which case they pass current, or they are 'off', in which case they do not pass current. Control device 310 sends signals to circuit 330 to control these switches according to exemplary aspects. The switches may comprise, for example, transistor gates or any other appropriate mechanism.

Circuit 330 also comprises two degeneration PMOS transistors T1 and T2, which are turned ON during the read and write procedures in order to allow circuit 330 to be connected to positive power supply voltage $V_{DD}$. Switch S4 acts as a pull-down transistor to couple the latch of the sense amplifier to ground, when turned ON. The switch S4 may selectively enable the circuit 330 to behave as a latch by turning ON and coupling the circuit 330 to ground. Alternatively, switch S4 may be turned off, thereby selectively disabling the latch and allowing the circuit 330 to generate a pre-amplified differential voltage across Node A and Node B.

In exemplary aspects, the respective gates of transistors M1 and M3 of the sense amplifier are coupled to each other and to switch S3. Switch S3 is coupled to Node B of the sense amplifier. The respective gates of transistors M2 and M4 are coupled to each other and to switch S1. The switch S1 is coupled to Node A of the sense amplifier.

The respective gates of transistors M1 and M3 are coupled to each other and to switch S5. The respective gates of transistors M2 and M4 are coupled to each other and to switch S6. Switches S5 and S6 are coupled to write inputs $V_{WRITE-A}$ and $V_{WRITE-B}$, respectively.

The respective gates of transistors M1 and M3 are coupled to each other and to switch S2. The respective gates of transistors M2 and M4 are coupled to each other and to switch S2. When in an 'ON' position, switch S2 links the respective gates of transistors M1, M2, M3, and M4.

Circuit 330 also includes a sensing circuit. The sensing circuit includes a clamping transistor T3 coupled to Node A and to a multiplexer transistor T5 which is connected to the bit cell (represented by variable resistor $R_{DATA}$). The sensing circuit also includes another clamping transistor T4 connected to Node B and to another multiplexer transistor T6, which is connected to a reference cell (represented by variable resistor $R_{REF}$).

Clamping transistors T3 and T4 are controlled by the voltages $V_{CLAMP}$, which is a clamp voltage used to control the flow of current through the bit cell and the reference cell. Multiplexor transistors T4 and T6 are controlled by $V_{MUX}$, which is a control signal used to select the bit cell (and reference cell) during read and write operations, from other bit cells in memory array comprising the bit cell.

As previously described, $R_{DATA}$ represents a resistance of a bit cell that is subject to a read or write operation. The reference cell has a resistance $R_{REF}$, which represents a reference resistance. The resistance may be relatively large, indicating that the bit cell stores a logical "1", or relatively small, indicating that the bit cell stores a logical "0". When a given current is applied to the bit cell, a relatively large resistance indicating logical "1" will be reflected by a voltage $V_{DATA}$ across the bit cell, which is larger than a voltage $V_{REF}$ across the resistance $R_{REF}$. On the other hand, a relatively small resistance indicating logical "0" will be reflected by a $V_{DATA}$ across the bit cell, which is smaller than a voltage $V_{REF}$ across the resistance $R_{REF}$. By applying the current to the bit cell and the reference cell, data voltage $V_{DATA}$ can be obtained across the bit cell at Node A, and reference voltage $V_{REF}$ can be obtained across the reference cell at Node B.

FIG. 7 generally illustrates a control table 700 such as might be used by control device 310 to perform sense amplifier read procedure 400 and/or sense amplifier write procedure 500. Control device 310 can perform read procedure 400 and/or write procedure 500 by controlling each of the switches S1, S2, S3, S4, S5, and S6 in accordance with the table 700.

Figure 8:
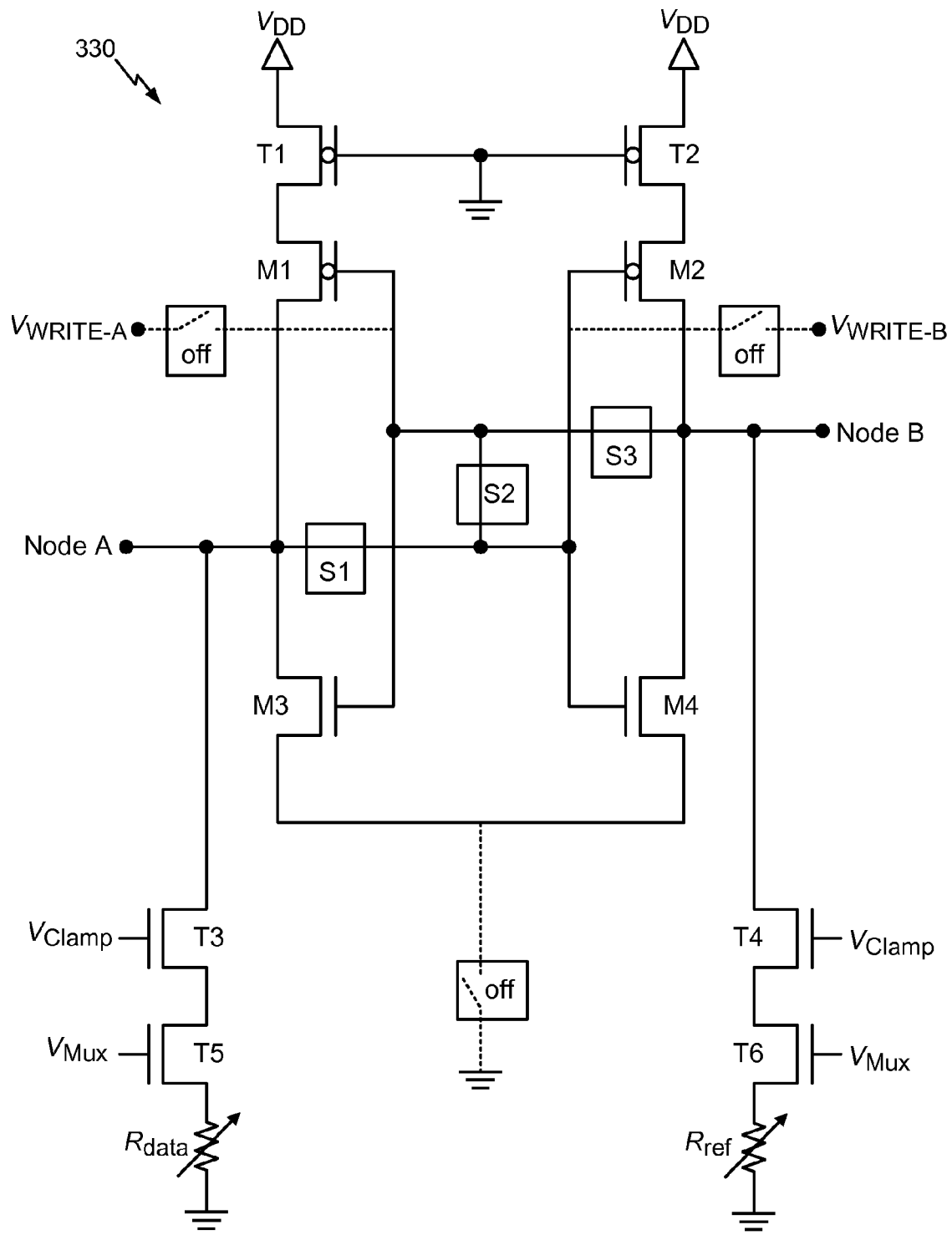
FIG. 8 illustrates the MRAM read/write circuit of FIG. 6 during an equalizing phase of a read procedure.
Figure 9:
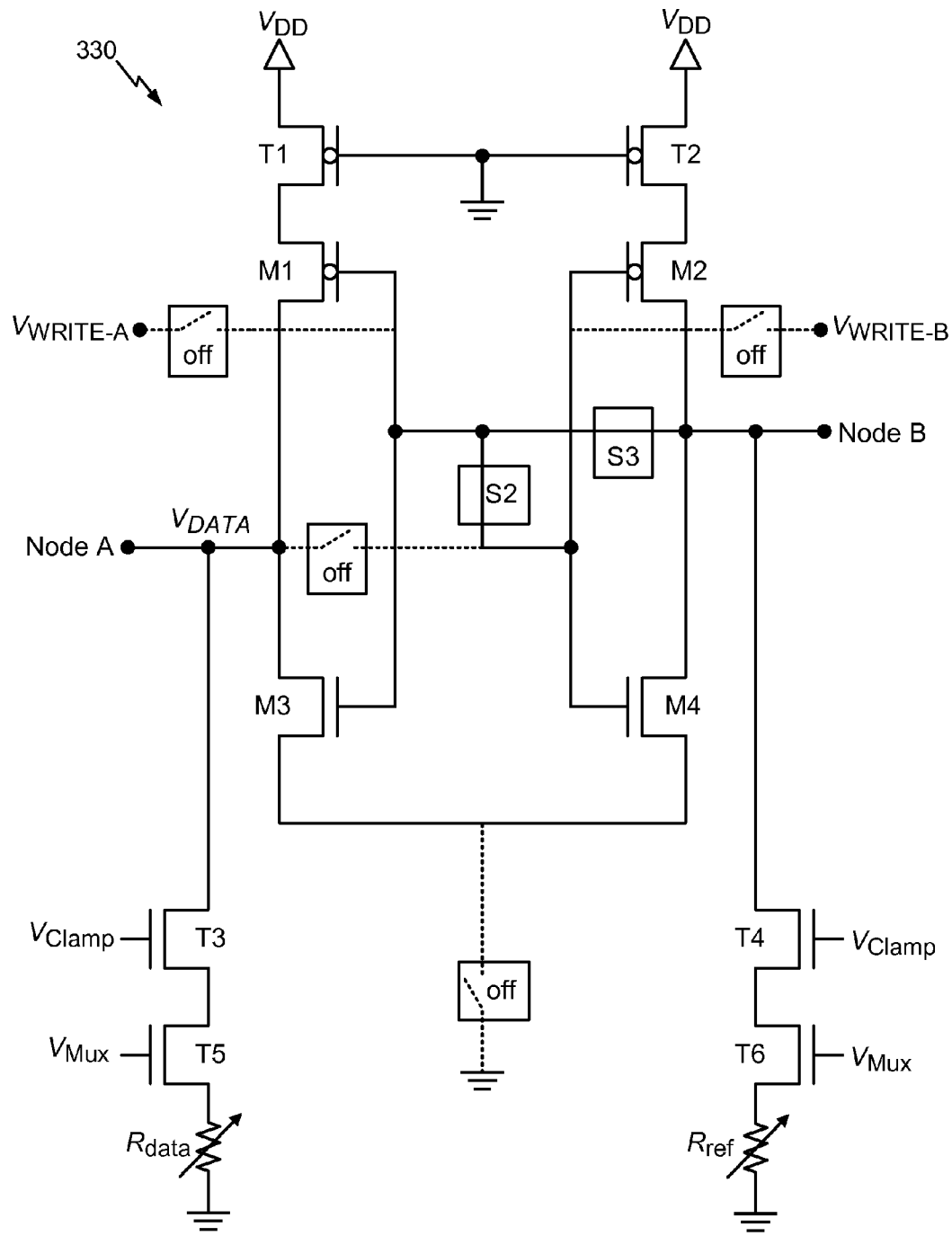
FIG. 9 illustrates the MRAM read/write circuit of FIG. 6 during a sensing circuit phase of a read procedure.
Figure 10:
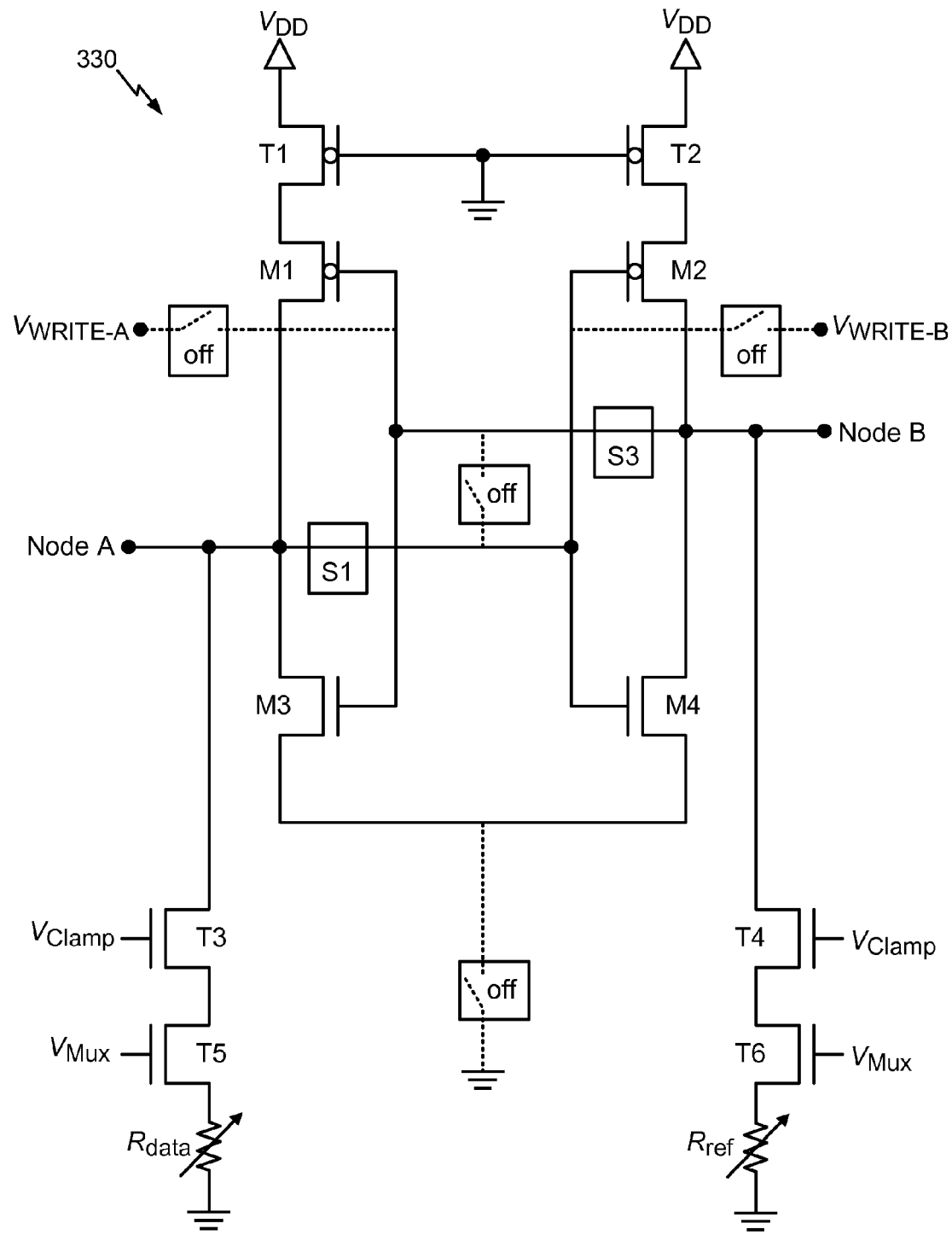
FIG. 10 illustrates the MRAM read/write circuit of FIG. 6 during a pre-amplifying phase of a read procedure.
Figure 11:
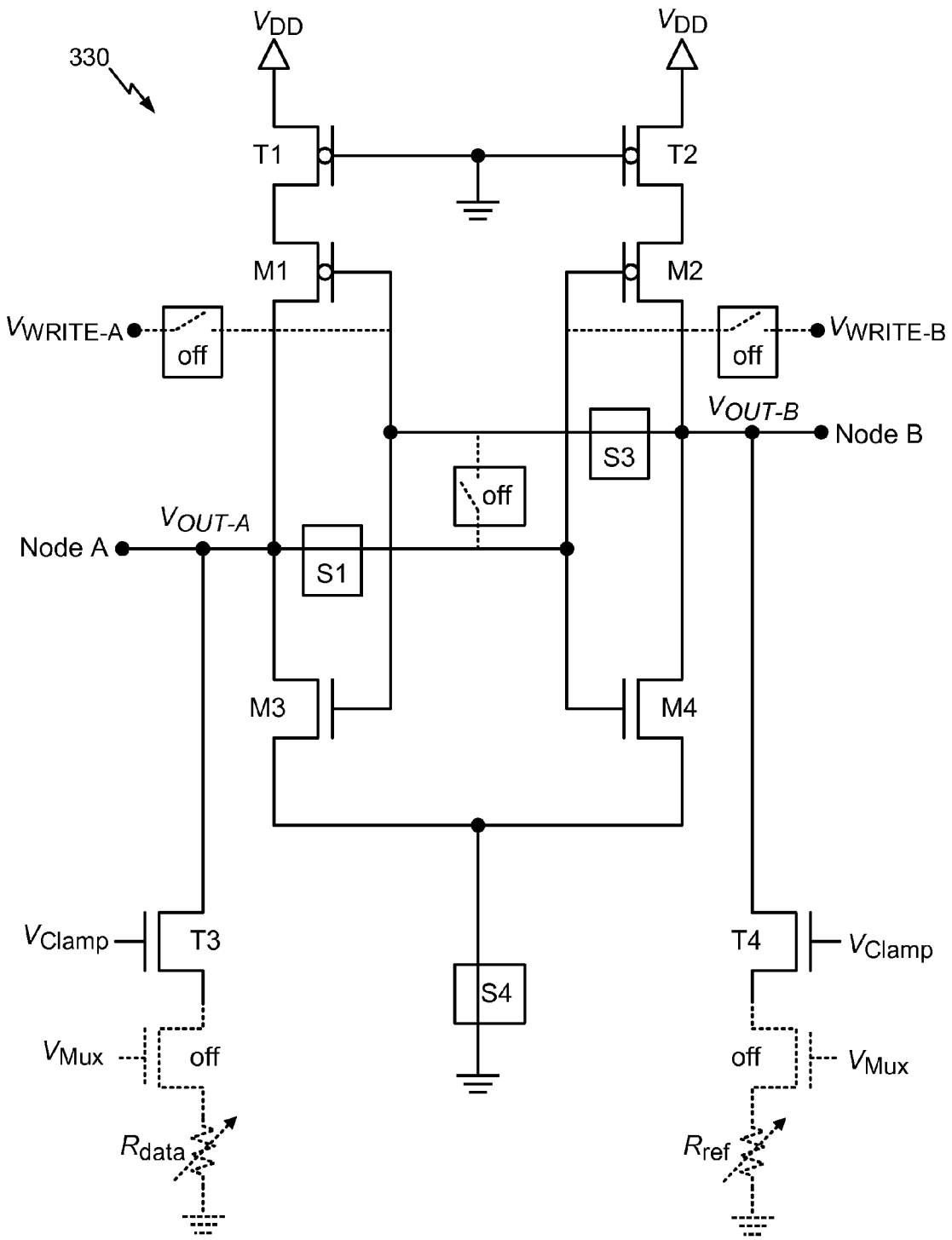
FIG. 11 illustrates the MRAM read/write circuit of FIG. 6 during a sense amplifier phase of a read procedure.

For example, the control device 310 can control read procedure 400 by first completing equalizing phase 410, then sensing circuit phase 420, then pre-amplifying phase 430, and finally sense amplifier phase 440. During equalizing phase 410 of read procedure 400, switches S1, S2, and S3 are 'ON', and switches S4, S5, and S6 are 'off', as shown in FIG. 8. During sensing circuit phase 420, switches S2 and S3 are 'ON', and switches S1, S4, S5, and S6 are 'off', as shown in FIG. 9. During pre-amplifying phase 430, switches S1 and S3 are 'ON', and switches S2, S4, S5, and S6 are 'off', as shown in FIG. 10. During the sense amplifier phase 440, switches S1, S3, and S4 are 'ON', and switches S2, S5, and S6 are 'off', as shown in FIG. 11.

Figure 12:
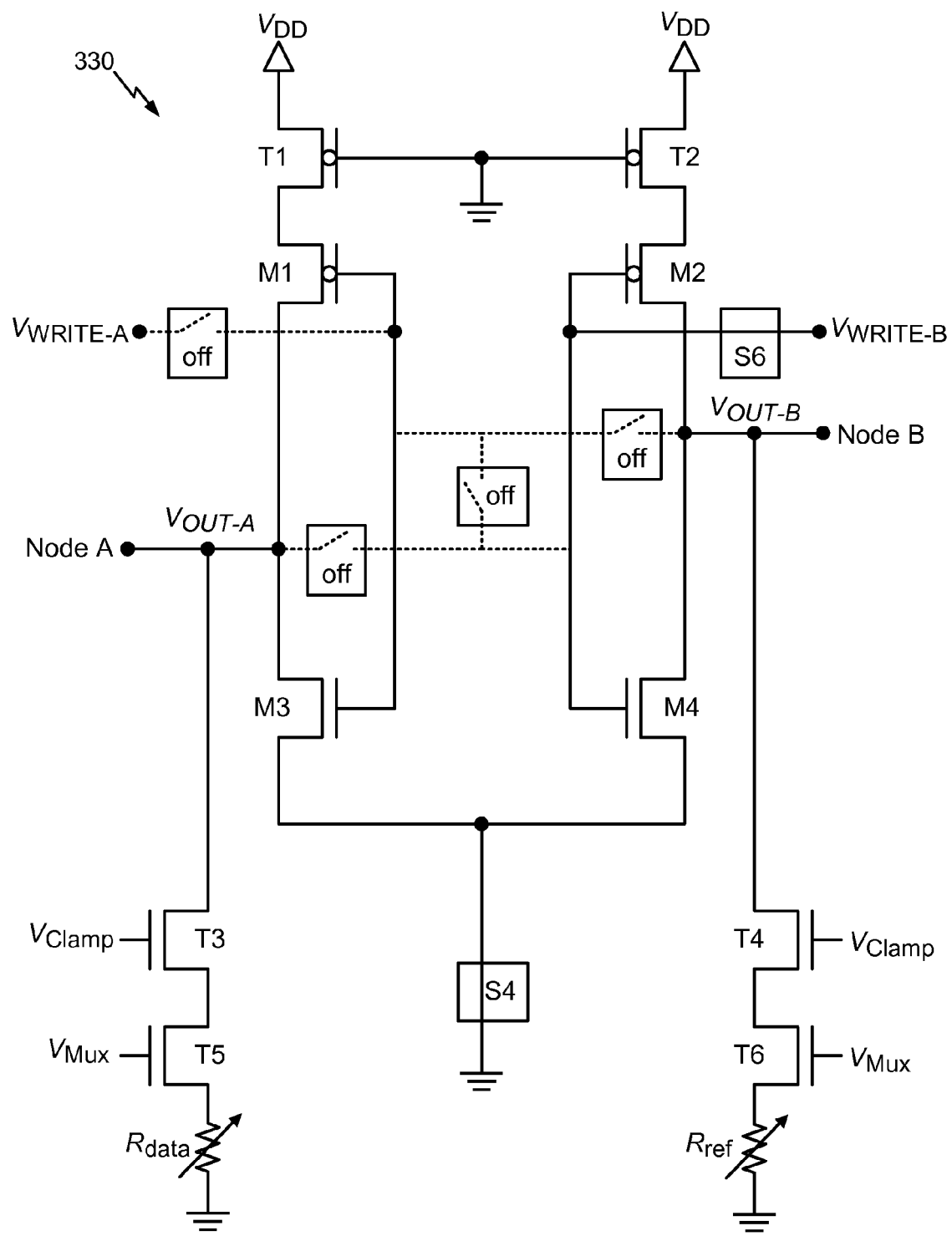
FIG. 12 illustrates the MRAM read/write circuit of FIG. 6 during a write phase of a write procedure.

In another example, control device 310 can control write procedure 500 by completing write phase 510. During write phase 510, switches S4, S5, and S6 are 'ON' and switches S1, S2, and S3 are 'off', as shown in FIG. 12. As FIG. 4 and FIG. 5 illustrate, the sense amplifier read procedure 400 and sense amplifier write procedure 500 are independent procedures that are independently implemented.

FIG. 8 generally illustrates circuit 330 in equalizing phase 410 where switches S1, S2, and S3 are 'ON', and switches S4, S5, and S6 are 'off'. In equalizing phase 410, Node A and Node B are coupled via switches S1, S2, and S3, each of which is in an 'ON' configuration. The signals $V_{CLAMP}$ and $V_{MUX}$ are on, as previously described for a read operation. As a result, the voltages at Node A and Node B are equalized. Moreover, the equalizing voltage at Node A and Node B is applied to the gates of PMOS transistors M1 and M2.

FIG. 9 generally illustrates circuit 330 in sensing circuit phase 420 where switches S2 and S3 are 'ON', and switches S1, S4, S5, and S6 are 'off'. During sensing circuit phase 420, the gates of transistors M1 and M2 remain coupled to one another via switch S2, and coupled to Node B via switch S3. However, since switch S1 is set to an 'off' position, Node A is now isolated or decoupled from Node B. As a result, Node A develops a voltage $V_{DATA}$ based on the resistance value $R_{DATA}$ of the bit cell. Node B simultaneously and independently develops a voltage $V_{REF}$ based on the resistance value $R_{REF}$. Moreover, the voltage at Node B is applied to the gates of transistors M1 and M2. During the sensing circuit phase 420, differential voltage $\Delta V_E$ defined as the difference between voltages $V_{DATA}$ and $V_{REF}$, develops between Node A and Node B, respectively.

FIG. 10 generally illustrates circuit 330 in pre-amplifying phase 430 where switches S1 and S3 are 'ON', and switches S2, S4, S5, and S6 are 'off'. As a result, the voltage $V_{DATA}$ at Node A is applied to the gate of transistor M2 (via switch S1) and the voltage $V_{REF}$ at Node B is applied to the gate of transistor M1 (via switch S3). Since switch S2 is in an 'off' configuration, voltage $V_{REF}$ (applied to the gate of transistors M1) is decoupled from voltage $V_{DATA}$ (applied to the gate of transistor M2). As a result, transistor M1 will pass relatively more or less current than transistor M2 depending on whether $\Delta V_1$ is positive or negative.

The current difference between M1 and M2 is not affected by threshold voltage mismatch of M1 and M2 because the transistors used in the sensing circuit phase 420 and pre-amplifying phase 430 are identical. The respective threshold voltages of M1 and M2 are already reflected in $V_{DATA}$ and $V_{REF}$. Thus, $\Delta V_1$ is amplified without the offset voltage.

In one possible scenario, the bit cell stores a logical "1". This state is represented by a resistance $R_{DATA}$ having a high resistance value. In this scenario, $V_{DATA}$ will be high relative to $V_{REF}$ and $\Delta V_1$ will be positive upon entering pre-amplifying phase 430. Accordingly, voltage applied to the gate of PMOS transistor M2 ($V_{DATA}$) will be high relative to the voltage applied to the gate of PMOS transistor M1 ($V_{REF}$), and less current will flow to Node B through PMOS transistor M2 than to Node A through PMOS transistor M1. As a result, the voltage at Node A will tend to rise, and the voltage at Node B will tend to diminish Because these voltages are fed back to the gates of transistors M2 and M1, respectively, positive feedback will occur. As a result, the voltages at Node A and Node B will be driven closer to $V_{DD}$ and $V_{SS}$, respectively.

In the foregoing scenario, the result of pre-amplifying phase 430 is that the positive differential voltage $\Delta V_1$ is pre-amplified, yielding a pre-amplified differential voltage $\Delta V_P$ of greater magnitude than $\Delta V_1$. It will be understood that if $\Delta V_1$ had been negative in the foregoing scenario (that is, if the bit cell had stored a logical "0"), then the voltages $V_{DATA}$ and $V_{REF}$ would have had the opposite effect on transistors M1 and M2 and the voltages at Node A and Node B would have been driven closer to $V_{SS}$ and $V_{DD}$, respectively. Thus, the pre-amplifying phase 430 would have pre-amplified negative differential voltage $\Delta V_1$ to a more negative pre-amplified differential voltage $\Delta V_E$.

FIG. 11 generally illustrates the circuit 330 in sense amplifier phase 440 where switches S1, S3, and S4 are 'ON', and switches S2, S5, and S6 are 'off'. In sense amplifier phase 440, Node A and Node B are decoupled from the bit cell and $R_{REF}$. Nodes A and B provide a pre-amplified differential voltage $\Delta V_P$ which is large enough to suppress the offset voltage in latch phase. In a scenario where pre-amplified differential voltage $\Delta V_P$ is positive, the voltage at Node A will be higher than the voltage at Node B, which will cause $V_{OUT-A}$ to rise rapidly towards $V_{DD}$ through transistors M1 and T1. The voltage $V_{OUT-B}$ will similarly rapidly fall towards ground or $V_{SS}$ through transistors M4 and S4. As a result, the differential voltage $\Delta V_2 = V_{OUT-A} - V_{OUT-B}$ will be available faster and will be correctly positive. In a scenario where pre-amplified differential voltage $\Delta V_P$ is negative, the transistors are each in an opposite configuration, and the output $\Delta V_2$ of the sense amplifier is similarly obtained in a fast and stable manner without impacts of latch offsets.

While implementations of circuit 330 have been described above with regard to the various phases of a read operation, circuit 330 can also configured for a write operation according to exemplary aspects, as shown in FIG. 12. It will be noted that implementing the write operation involves reuse of components discussed above for the read operation, which results in cost savings. In FIG. 12, circuit 330 is illustrated in write phase 510 where switches S4, S5, and S6 are 'ON', and switches S1, S2, and S3 are 'off'. In write phase 510, write signal $V_{WRITE-A}$ is applied to the gates of transistors M1 and M3 via switch S5. Additionally or alternatively, write signal $V_{WRITE-B}$ is applied to the gates of transistors M2 and M4 via switch S6. As previously noted, for writing the MTJ bit cell, current is passed through the bit cell to effect a corresponding alignment of the free layer and the fixed layer, which changes the resistance to reflect the logical value being written. Thus, in order to write a logical value of "1" in the bit cell or the reference cell, $V_{WRITE-A}$ or $V_{WRITE-B}$, respectively, will be driven to a high voltage. These voltages are driven through switches S5 and S6, respectively. For a write of "0" in the bit cell or the reference cell, the opposite voltages will be driven on $V_{WRITE-A}$ and $V_{WRITE-B}$, effecting a lower resistance to be programmed into the bit cell or reference cell.

Figure 13:
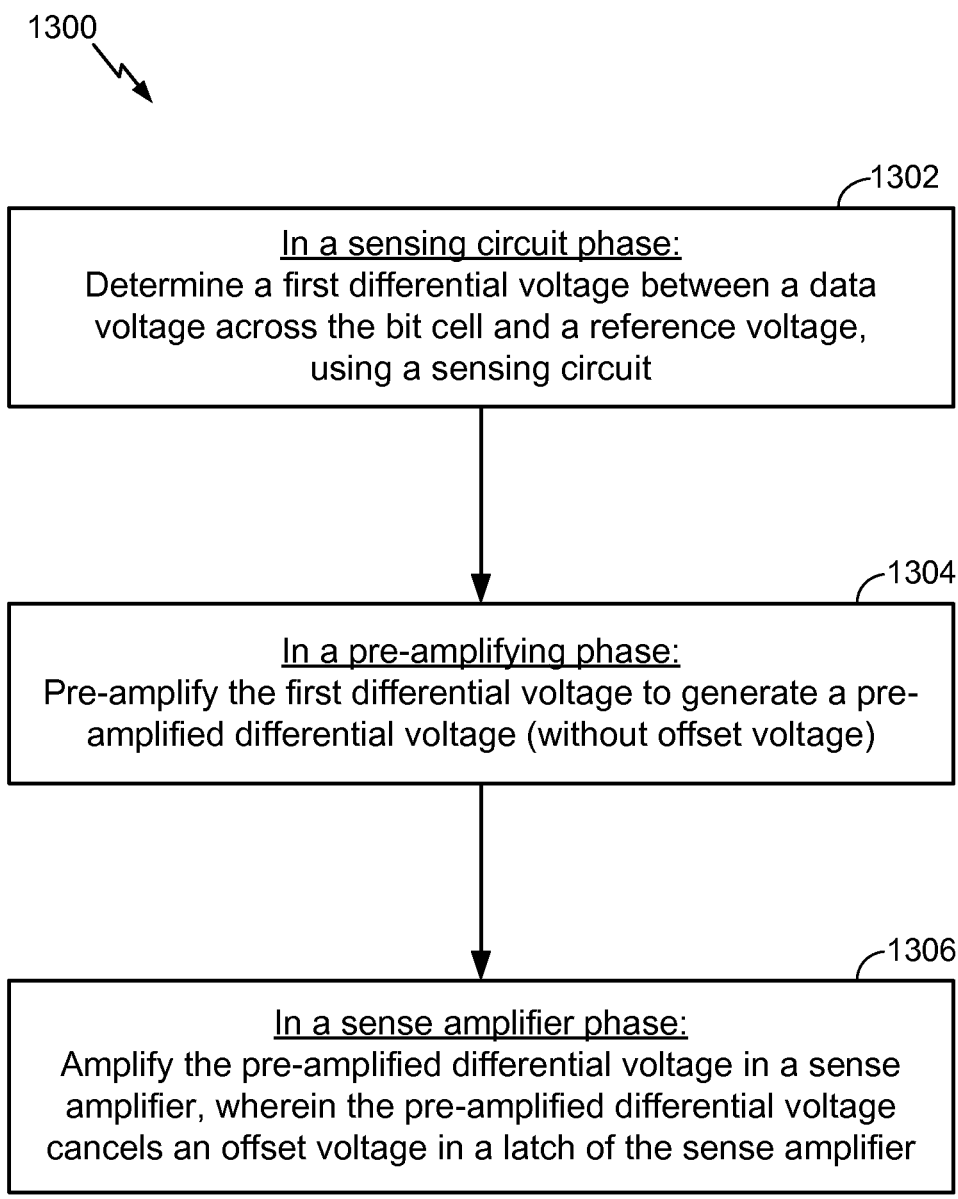
FIG. 13 illustrates a flowchart of operating a MRAM bit cell according to an exemplary aspect.

Accordingly, it will be appreciated that aspects include various methods for performing the processes, functions and/or algorithms disclosed herein. For example, as illustrated in FIG. 13, an aspect can include a method (1300) of operating a magnetoresistive random access memory (MRAM) bit cell. The method comprises: in a sensing circuit phase, determining a first differential voltage between a data voltage across the bit cell and a reference voltage, using a sensing circuit—Block 1302; in a pre-amplifying phase, pre-amplifying the first differential voltage to generate a pre-amplified differential voltage without offset voltage—Block 1304; and in a sense amplifier phase, amplifying the pre-amplified differential voltage in a sense amplifier, wherein the pre-amplified differential voltage cancels an offset voltage in a latch of the sense amplifier—Block 1306.

Figure 14:
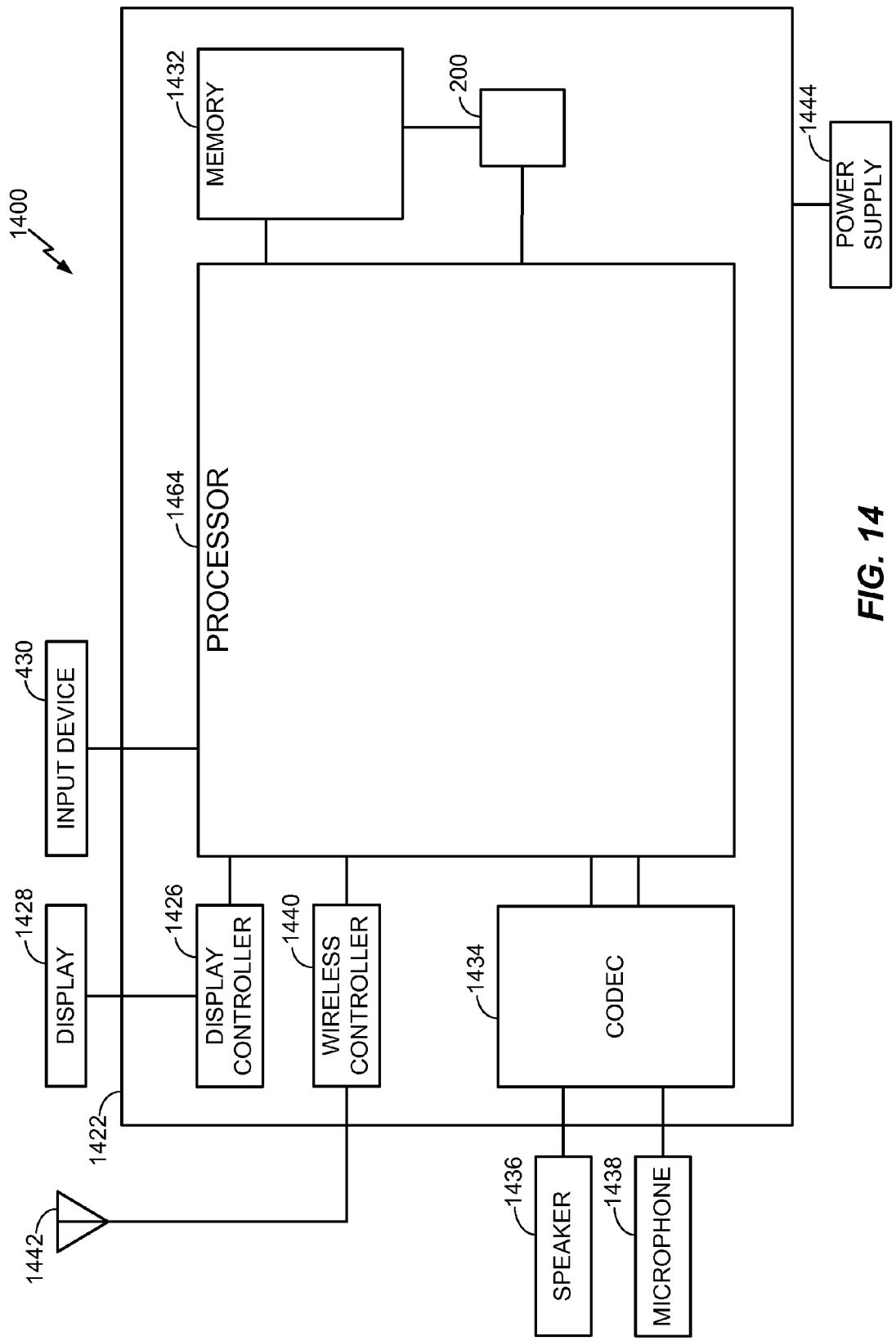
FIG. 14 illustrates a high-level diagram of a wireless device in which exemplary aspects may be advantageously employed.

Referring to FIG. 14, a block diagram of a particular illustrative aspect of wireless device 1400 configured according to exemplary aspects is depicted. Wireless device 1400 includes processor 1464 coupled to memory 1432. Memory 1432 may include a MRAM array, and processor 1464 and memory 1432 may be coupled to circuit 200 of FIG. 2 for operating MRAM bit cells of the MRAM array in one aspect. FIG. 14 also shows display controller 1426 that is coupled to processor 1464 and to display 1428. Coder/decoder (CODEC) 1434 (e.g., an audio and/or voice CODEC) can be coupled to processor 1464. Other components, such as wireless controller 1440 (which may include a modem) are also illustrated. Speaker 1436 and microphone 1438 can be coupled to CODEC 1434. FIG. 14 also indicates that wireless controller 1440 can be coupled to wireless antenna 1442. In a particular aspect, processor 1464, display controller 1426, memory 1432, CODEC 1434, and wireless controller 1440 are included in a system-in-package or system-on-chip device 1422.

In a particular aspect, input device 1430 and power supply 1444 are coupled to the system-on-chip device 1422. Moreover, in a particular aspect, as illustrated in FIG. 14, display 1428, input device 1430, speaker 1436, microphone 1438, wireless antenna 1442, and power supply 1444 are external to the system-on-chip device 1422. However, each of display 1428, input device 1430, speaker 1436, microphone 1438, wireless antenna 1442, and power supply 1444 can be coupled to a component of the system-on-chip device 1422, such as an interface or a controller.

It should be noted that although FIG. 14 depicts a wireless communications device, processor 1464 and memory 1432 may also be integrated into a set-top box, a music player, a video player, an entertainment unit, a navigation device, a personal digital assistant (PDA), a fixed location data unit, a mobile phone, a smart phone, or a computer.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Accordingly, an exemplary aspect can include a computer readable media embodying a method of operating an MRAM bit cell. Accordingly, the invention is not limited to illustrated examples and any means for performing the functionality described herein are included in embodiments of the invention.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of operating a magnetoresistive random access memory (MRAM) bit cell in a circuit comprising a first transistor pair having a first node therebetween and a second transistor pair having a second node therebetween, the method comprising:
    equalizing the first node and the second node by coupling the first node to the second node and to gates of the second transistor pair;
    developing a differential voltage between the first node and the second node by decoupling the first node from the second node, the gates of the second transistor pair, or both;
    pre-amplifying the differential voltage to generate a pre-amplified differential voltage without offset voltage by coupling the first node to the gates of the second transistor pair; and
    latching the pre-amplified differential voltage by decoupling the first node from the MRAM bit cell and decoupling the second node from a reference bit cell.

2. The method of claim 1, wherein developing the differential voltage further comprises coupling the first node to the MRAM bit cell to develop a data voltage at the first node and coupling the second node to the reference bit cell to develop a reference voltage.

3. The method of claim 1, wherein the first transistor pair and the second transistor pair are decoupled from ground during the equalizing of the first node and the second node, the developing of the differential voltage, and the pre-amplifying of the differential voltage.

4. The method of claim 1, wherein latching the pre-amplified differential voltage further comprises coupling the first transistor pair and the second transistor pair to ground.

5. The method of claim 1, further comprising writing a write value to one or more of the MRAM bit cell and the reference bit cell by coupling the first node to the MRAM bit cell, coupling the second node to the reference bit cell, and coupling write drivers to the gates of the first transistor pair, the gates of the second transistor pair, or both.

6. An apparatus comprising:
a magnetoresistive random access memory (MRAM) bit cell; and
a circuit comprising a first transistor pair having a first node therebetween and a second transistor pair having a second node therebetween, the circuit being configured to:
equalize the first node and the second node by coupling the first node to the second node and to gates of the second transistor pair;
develop a differential voltage between the first node and the second node by decoupling the first node from the second node, the gates of the second transistor pair, or both;
pre-amplify the differential voltage in order to generate a pre-amplified differential voltage without offset voltage by coupling the first node to the gates of the second transistor pair; and
latch the pre-amplified differential voltage by decoupling the first node from the MRAM bit cell and decoupling the second node from a reference bit cell.

7. The apparatus of claim 6, wherein the circuit is further configured to develop the differential voltage by coupling the first node to the MRAM bit cell to develop a data voltage and coupling the second node to the reference bit cell to develop a reference voltage.

8. The apparatus of claim 6, wherein the circuit further comprises:
a first switch configured to decouple the first node from the gates of the second transistor pair to develop the differential voltage and couple the first node to the gates of the second transistor pair to pre-amplify the differential voltage; and
a second switch configured to couple the gates of the first transistor pair to the gates of the second transistor pair to develop the differential voltage and to decouple the first transistor pair from the second transistor pair to pre-amplify the differential voltage.

9. The apparatus of claim 8, further comprising:
a first multiplexer transistor configured to decouple the first node from the MRAM bit cell to latch the pre-amplified differential voltage; and
a second multiplexer transistor configured to decouple the second node from the reference bit cell to latch the pre-amplified differential voltage.

10. The apparatus of claim 6, wherein the circuit further comprises:
a third switch configured to couple the second node to the gates of the first transistor pair to develop the differential voltage and pre-amplify the differential voltage and to decouple the second node from the gates of the first transistor pair to write a write value to one or more of the MRAM bit cell and the reference bit cell.

11. The apparatus of claim 6, wherein the circuit further comprises:
a fourth switch configured to decouple the first transistor pair and the second transistor pair from ground to latch the pre-amplified differential voltage and to couple the first transistor pair and the second transistor pair to ground to develop the differential voltage and pre-amplify the differential voltage.

12. The apparatus of claim 6, wherein the circuit is further configured to write a write value to one or more of the MRAM bit cell and the reference bit cell by decoupling the first node from the second node and decoupling the gates of the first transistor pair from the gates of the second transistor pair.

13. The apparatus of claim 12, wherein the write drivers comprise:
a fifth switch configured to couple a data write signal to the gates of the first transistor pair in order to write a data write value to the MRAM bit cell and further configured to decouple the data write signal from the gates of the first transistor pair to develop the differential voltage, pre-amplify the differential voltage, and latch the pre-amplified differential voltage; and
a sixth switch configured to couple a reference write signal to the gates of the second transistor pair in order to write a reference write value to the reference bit cell and further configured to decouple the reference write signal from the gates of the second transistor pair to develop the differential voltage, pre-amplify the differential voltage, and latch the pre-amplified differential voltage.

14. The apparatus of claim 6, integrated in at least one semiconductor device.

15. The apparatus of claim 6, integrated in a device, selected from the group consisting of a set top box, music player, video player, entertainment unit, navigation device, communications device, personal digital assistant (PDA), fixed location data unit, and a computer.

16. A system comprising:
means for equalizing a first node and a second node by coupling the first node to the second node and to gates of a second transistor pair;
means for developing a differential voltage between the first node and the second node by decoupling the first node from the second node, the gates of the second transistor pair, or both;
means for pre-amplifying the differential voltage in order to generate a pre-amplified differential voltage without offset voltage by coupling the first node to the gates of the second transistor pair; and
means for latching the pre-amplified differential voltage by decoupling the first node from a magnetoresistive random access memory (MRAM) bit cell and decoupling the second node from a reference bit cell.

17. The system of claim 16, wherein means for developing the differential voltage further comprises means for coupling the first node to the MRAM bit cell to develop a data voltage at the first node and means for coupling the second node to the reference bit cell to develop a reference voltage across the reference voltage at the second node.

* * * * *